(12) United States Patent
Musselman et al.

(10) Patent No.: US 10,763,142 B2
(45) Date of Patent: Sep. 1, 2020

(54) SYSTEM AND METHOD FOR DETERMINING FIELD NON-UNIFORMITIES OF A WAFER PROCESSING CHAMBER USING A WAFER PROCESSING PARAMETER

(71) Applicant: Lam Research Corporation, Fremont, CA (US)

(72) Inventors: Marcus Musselman, Oakland, CA (US); Juan Valdivia, III, Fremont, CA (US); Hua Xiang, Pleasanton, CA (US); Andrew D. Bailey, III, Pleasanton, CA (US); Yoko Yamaguchi, Union City, CA (US); Qian Fu, Pleasanton, CA (US); Aaron Eppler, Fremont, CA (US)

(73) Assignee: LAM RESEARCH CORPORATION, Fremont, CA (US)

(*) Notice: Subject to any disclaimer, the term of this patent is extended or adjusted under 35 U.S.C. 154(b) by 470 days.

(21) Appl. No.: 14/860,078

(22) Filed: Sep. 21, 2015

(65) Prior Publication Data
US 2016/0370796 A1   Dec. 22, 2016

Related U.S. Application Data

(60) Provisional application No. 62/182,884, filed on Jun. 22, 2015.

(51) Int. Cl.
*G05B 19/418* (2006.01)
*H01L 21/67* (2006.01)

(52) U.S. Cl.
CPC .. *H01L 21/67253* (2013.01); *G05B 19/41875* (2013.01); *G05B 2219/32018* (2013.01); *G05B 2219/45031* (2013.01); *Y02P 90/22* (2015.11)

(58) Field of Classification Search
CPC ............... G05B 19/41875; Y02P 90/22; H01L 21/67253
See application file for complete search history.

(56) References Cited

U.S. PATENT DOCUMENTS

| | | | |
|---|---|---|---|
| 4,503,335 A | 3/1985 | Takahashi | |
| 5,475,610 A | 12/1995 | Atwood et al. | |
| 5,667,622 A * | 9/1997 | Hasegawa | H01L 21/67069 156/345.27 |
| 5,810,933 A | 9/1998 | Mountsier et al. | |
| 6,091,060 A | 7/2000 | Getchel et al. | |
| 6,191,394 B1 | 2/2001 | Shirakawa et al. | |
| 6,259,072 B1 | 7/2001 | Kinnard et al. | |

(Continued)

*Primary Examiner* — Michele Fan

(57) ABSTRACT

A system for controlling a condition of a wafer processing chamber is disclosed. According the principles of the present disclosure, the system includes memory and a first controller. The memory stores a plurality of profiles of respective ones of a plurality of first control elements. The plurality of first control elements are arranged throughout the chamber. The first controller determines non-uniformities in a substrate processing parameter associated with the plurality of first control elements. The substrate processing parameter is different than the condition of the chamber. The first controller adjusts at least one of the plurality of profiles based on the non-uniformities in the substrate processing parameter and a sensitivity of the substrate processing parameter to the condition.

19 Claims, 5 Drawing Sheets

(56) References Cited

U.S. PATENT DOCUMENTS

| | | |
|---|---|---|
| 6,342,691 B1 | 1/2002 | Johnsgard et al. |
| 6,644,965 B2 | 11/2003 | Ookura et al. |
| 6,967,177 B1 | 11/2005 | May et al. |
| 7,415,312 B2 | 8/2008 | Barnett, Jr. et al. |
| 7,897,897 B2 | 3/2011 | Jyousaka et al. |
| 7,952,049 B2 | 5/2011 | Tsukamoto |
| 8,092,639 B2 | 1/2012 | Buchberger, Jr. et al. |
| 8,461,674 B2 | 6/2013 | Gaff et al. |
| 8,546,732 B2 | 10/2013 | Singh |
| 8,587,113 B2 | 11/2013 | Gaff et al. |
| 8,608,900 B2 | 12/2013 | Buchberger, Jr. et al. |
| 8,624,168 B2 | 1/2014 | Gaff et al. |
| 8,637,794 B2 | 1/2014 | Singh et al. |
| 8,642,480 B2 | 2/2014 | Gaff et al. |
| 8,680,441 B2 | 3/2014 | Singh |
| 8,691,598 B1 | 4/2014 | McWhirter et al. |
| 8,755,204 B2 | 6/2014 | Benjamin |
| 8,791,392 B2 | 7/2014 | Singh |
| 8,809,747 B2 | 8/2014 | Pease et al. |
| 8,809,774 B2 | 8/2014 | Vertes et al. |
| 8,852,964 B2 | 10/2014 | Kimura et al. |
| 8,884,194 B2 | 11/2014 | Singh et al. |
| 9,089,007 B2 | 7/2015 | Yang et al. |
| 9,123,755 B2 | 9/2015 | Swanson et al. |
| 9,245,768 B2 | 1/2016 | Aderhold |
| 9,779,974 B2 | 10/2017 | Zhang et al. |
| 2001/0019741 A1 | 9/2001 | Inaba et al. |
| 2002/0003037 A1 | 1/2002 | Cousineau et al. |
| 2002/0030047 A1 | 3/2002 | Shao et al. |
| 2002/0062954 A1 | 5/2002 | Getchel et al. |
| 2003/0029834 A1* | 2/2003 | Lill .................. H01J 37/321 216/59 |
| 2003/0155939 A1 | 8/2003 | Lutz et al. |
| 2003/0186545 A1 | 10/2003 | Kamp et al. |
| 2004/0012404 A1 | 1/2004 | Feder et al. |
| 2004/0156625 A1 | 8/2004 | Garmer et al. |
| 2004/0266200 A1* | 12/2004 | Schaller ............. H01L 21/266 438/705 |
| 2005/0098535 A1* | 5/2005 | Lansford ........... H01L 21/67253 216/59 |
| 2005/0099758 A1 | 5/2005 | Kellerman et al. |
| 2005/0173403 A1 | 8/2005 | Benjamin et al. |
| 2006/0051077 A1 | 3/2006 | Kubo |
| 2006/0084188 A1 | 4/2006 | You et al. |
| 2007/0251456 A1 | 11/2007 | Herchen et al. |
| 2008/0023656 A1 | 1/2008 | Quach et al. |
| 2008/0073335 A1 | 3/2008 | Tsukamoto |
| 2008/0142500 A1 | 6/2008 | Tomita et al. |
| 2008/0170969 A1* | 7/2008 | Yoshioka ........... H01L 21/67109 422/109 |
| 2008/0230866 A1 | 9/2008 | Kulp |
| 2008/0280451 A1 | 11/2008 | Ohmoto et al. |
| 2009/0008381 A1 | 1/2009 | Jyousaka et al. |
| 2009/0110824 A1 | 4/2009 | Takenaga et al. |
| 2010/0332013 A1* | 12/2010 | Choi .................. G05B 23/0254 700/110 |
| 2011/0143462 A1 | 6/2011 | Gaff et al. |
| 2011/0186545 A1 | 8/2011 | Mahadeswaraswamy et al. |
| 2012/0112068 A1 | 5/2012 | Maeda et al. |
| 2012/0185103 A1* | 7/2012 | Blair ................... F01K 13/02 700/288 |
| 2013/0167769 A1 | 7/2013 | Shamoun |
| 2014/0073066 A1 | 3/2014 | Tabuchi |
| 2014/0154819 A1 | 6/2014 | Gaff et al. |
| 2014/0166632 A1 | 6/2014 | McWhirter et al. |
| 2014/0220709 A1 | 8/2014 | Kimura et al. |
| 2015/0060013 A1 | 3/2015 | Buchberger, Jr. |
| 2015/0071623 A1 | 3/2015 | Ranish |
| 2015/0132863 A1 | 5/2015 | Oohashi |
| 2015/0170917 A1 | 6/2015 | Ho et al. |
| 2015/0170934 A1 | 6/2015 | Aderhold |
| 2015/0176928 A1 | 6/2015 | Tabuchi |
| 2015/0340255 A1 | 11/2015 | Parkhe et al. |
| 2016/0027678 A1 | 1/2016 | Parkhe et al. |
| 2016/0086818 A1 | 3/2016 | Hamano et al. |
| 2016/0225645 A1 | 8/2016 | Koizumi et al. |
| 2016/0345384 A1 | 11/2016 | Zhang et al. |
| 2016/0370788 A1 | 12/2016 | Bailey, III et al. |
| 2017/0133251 A1 | 5/2017 | Wu et al. |
| 2017/0215230 A1 | 7/2017 | Parkhe |

* cited by examiner

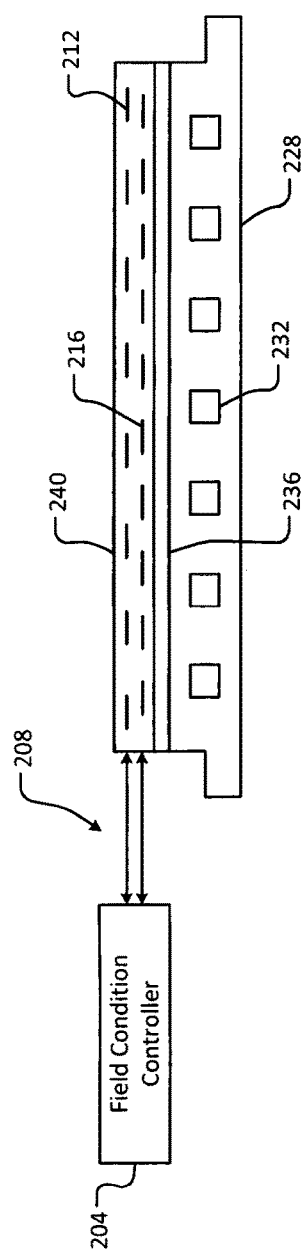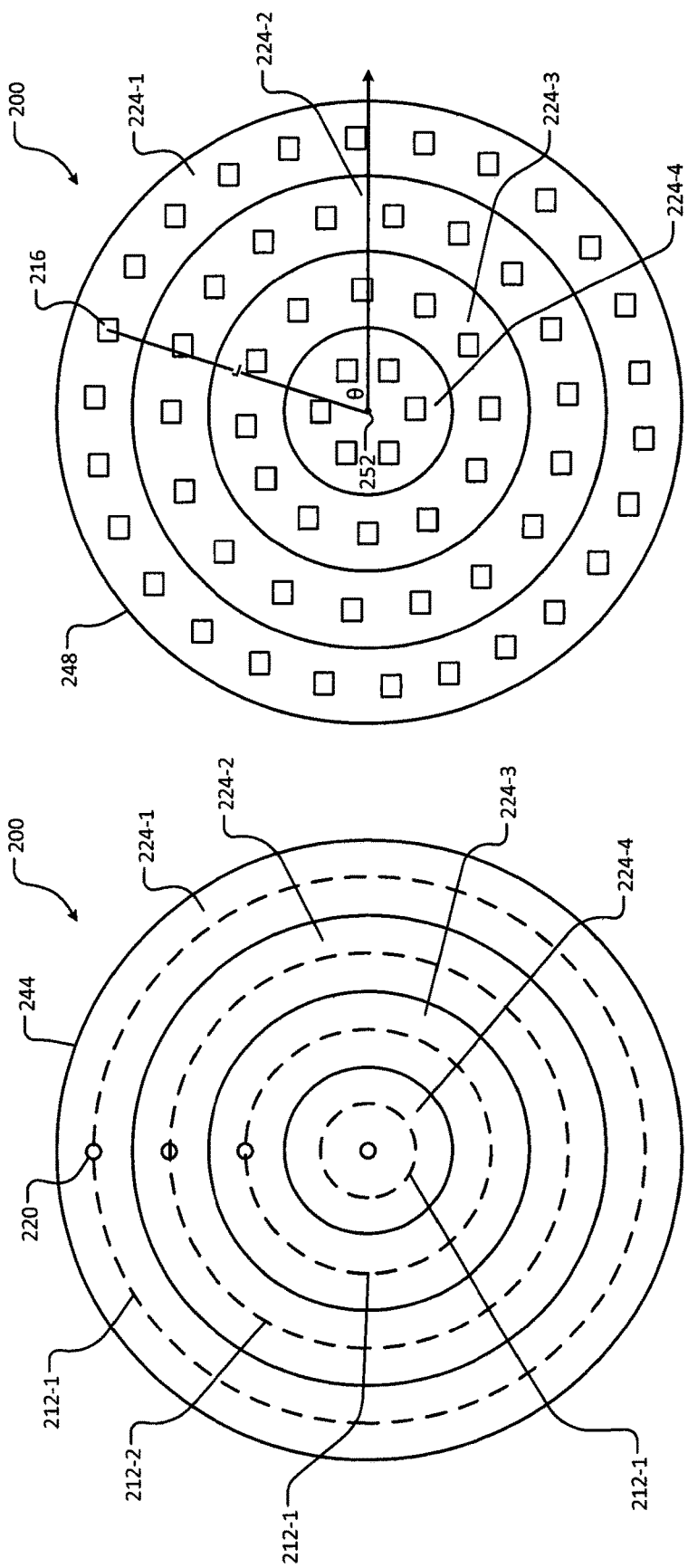

SYSTEM AND METHOD FOR DETERMINING FIELD NON-UNIFORMITIES OF A WAFER PROCESSING CHAMBER USING A WAFER PROCESSING PARAMETER

CROSS-REFERENCE TO RELATED APPLICATIONS

This application claims the benefit of U.S. Provisional Application No. 62/182,884, filed on Jun. 22, 2015. The entire disclosure of the application referenced above is incorporated herein by reference.

FIELD

The present disclosure relates to substrate processing systems, and more particularly, to systems and methods for determining field non-uniformities of a wafer processing chamber using a wafer processing parameter.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to perform etching, deposition, and/or other treatment of substrates such as semiconductor wafers. Example processes that may be performed on a substrate include, but are not limited to, a plasma enhanced chemical vapor deposition (PECVD) process, a chemically enhanced plasma vapor deposition (CEPVD) process, a sputtering physical vapor deposition (PVD) process, an ion implantation process, and/or other etch, deposition, and cleaning processes. A substrate may be arranged on a pedestal, an electrostatic chuck (ESC), etc. in a processing chamber of the substrate processing system. For example, during etching in a PECVD process, a gas mixture including one or more precursors is introduced into the processing chamber and plasma is struck to etch the substrate.

During process steps, field conditions such as temperatures and ion densities of various components of the system, and the substrate itself, may vary. These field variations may have undesirable effects on the resulting substrates (e.g., non-uniform critical dimensions). Accordingly, substrate processing systems may implement various systems and methods for controlling field conditions of various components and the substrates during processing.

SUMMARY

A system for controlling a condition of a wafer processing chamber according to the principles of the present disclosure includes memory and a first controller. The memory stores a plurality of profiles of respective ones of a plurality of first control elements. The plurality of first control elements are arranged throughout the chamber. The first controller determines non-uniformities in a substrate processing parameter associated with the plurality of first control elements. The substrate processing parameter is different than the condition of the chamber. The first controller adjusts at least one of the plurality of profiles based on the non-uniformities in the substrate processing parameter and a sensitivity of the substrate processing parameter to the condition.

A method for controlling a condition of a wafer processing chamber according to the principles of the present disclosure includes storing in memory a plurality of profiles of respective ones of a plurality of first control elements. The plurality of first control elements are arranged throughout the chamber. The method also includes determining non-uniformities in a substrate processing parameter associated with the plurality of first control elements. The substrate processing parameter is different than the condition of the chamber. The method further includes adjusting at least one of the plurality of profiles based on the non-uniformities in the substrate processing parameter and a sensitivity of the substrate processing parameter to the condition.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 2A is an example electrostatic chuck according to the principles of the present disclosure;

FIG. 2B illustrates zones and macro control elements of an example electrostatic chuck according to the principles of the present disclosure;

FIG. 2C illustrates zones and micro control elements of an example electrostatic chuck according to the principles of the present disclosure;

In the drawings, reference numbers may be reused to identify similar and/or identical elements.

DETAILED DESCRIPTION

Figure 1:
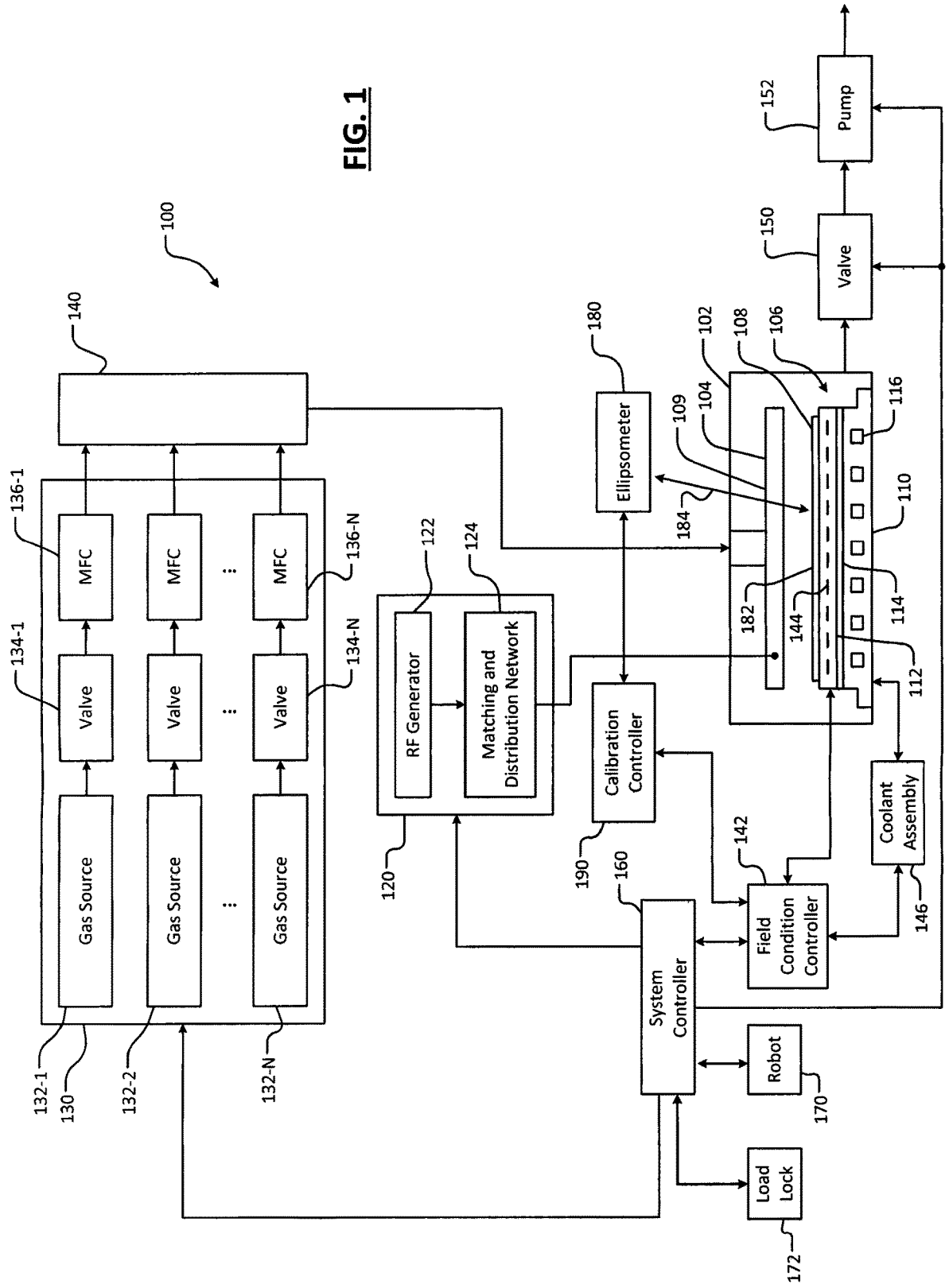
FIG. 1 is a functional block diagram of an example substrate processing system including an electrostatic chuck according to the principles of the present disclosure.

In a substrate processing system, various conditions of fields within a processing chamber may be controlled during process steps. For example, different processes and respective steps may require that a substrate is maintained at different temperatures. Thus, a contact surface temperature of an electrostatic chuck (ESC) within the processing chamber may be controlled to maintain the substrate at desired temperatures. For example only, the ESC may include a heating plate (e.g., a ceramic heating plate). The substrate may be arranged on the heating plate. Accordingly, the temperature of the heating plate is controlled to achieve the desired temperatures of the substrate.

In another example, different processes such as plasma generation may require that the processing chamber is maintained at different ion densities. Thus, RF antennas may be concentrically disposed on or within the ESC for generating RF signals to maintain the processing chamber at desired ion densities. While the frequency of the RF signals may be fixed, the amplitude of the RF signals may be varied by varying the power supplied to the RF antennas in order to achieve the desired ion densities.

Variations in the manufacturing process may cause corresponding variations in the characteristics of the processing chamber and the performance of the field conditions control of the processing chamber. For example, variations (i.e., non-uniformities) may include, but are not limited to, variations in thicknesses of silicone bond layers, variations in the flatness of machined surfaces, and/or variations in characteristics of respective control elements (TCEs) within the heating plate. These non-uniformities may result in local differences in heat transfer (i.e., local temperature non-uniformity), and therefore non-uniformities in substrate temperatures.

In chamber condition auto-correction systems and methods according to the principles of the present disclosure, a chamber including multiple zones (e.g., a chamber including a multi-zone ESC) may include respective macro control elements (CEs) for each zone within the chamber and a plurality of micro CEs distributed throughout the chamber. The macro and micro CEs may be macro and micro TCEs, respectively, that control temperatures within respective zones or fields of the chamber. Additionally or alternatively, the micro and micro CEs may be macro and micro RF antennas, respectively, that control ion densities within respective zones or fields the chamber. The macro CEs may be controlled to roughly achieve a desired setpoint value for a condition in each of the respective zones or fields. However, since each macro CE adjusts the condition of an entire respective zone or field, non-uniformities within each zone or field may cause corresponding condition non-uniformities in that zone or field. These field non-uniformities are therefore not correctable merely by adjusting the respective macro CEs.

Accordingly, the plurality of micro CEs may be individually controlled to compensate for the field non-uniformities in each zone of the chamber. For example, for each setpoint temperature of a macro TCE, a temperature response on a surface of the heating plate of the ESC may be known and mapped (i.e., stored in memory). Similarly, a temperature response of each of the micro TCEs on the surface of the heating plate may be known and mapped. When a macro TCE is controlled to a setpoint temperature, the micro TCEs may be automatically controlled to compensate for any known temperature non-uniformities at that setpoint temperature.

For a given setpoint condition, field non-uniformities may be different when plasma is on (generated) relative to field non-uniformities when plasma is off (not generated). In turn, a predetermined relationship between setpoint conditions and field non-uniformities and may become less accurate. This may diminish the ability to automatically control the micro CEs to compensate for field non-uniformities. As a result, field non-uniformities may increase or decrease when plasma is on relative to field non-uniformities when plasma is off.

A field non-uniformity determination system and method according to the present disclosure determines field non-uniformities based on non-uniformities of a wafer processing parameter when plasma is on. In the discussion below, the wafer processing parameter used to determine field non-uniformities is an etch rate of a masking material or film on a substrate, as the etch rate is sensitive to field conditions such as temperature. However, other wafer processing parameters that are sensitive to a field condition may be used, including a width, diameter, or depth of a feature such as a hole or a trench in the masking material.

A chamber condition auto-correction system and method according to the present disclosure controls the micro CEs to compensate for the field non-uniformities determined based on the non-uniformities of the wafer processing parameter. Since the non-uniformities of the wafer processing parameter are determined when plasma is on, the field non-uniformities determined based on the non-uniformities of the wafer processing parameter are accurate when plasma is on. As a result, field conditions of the chamber may be accurately controlled when plasma is on.

Although the chamber condition auto-correction systems and methods are described with respect to a multi-zone ESC, those skilled in the art can appreciate that the principles of the present disclosure may be applied to other condition-controlled components of a substrate processing system.

Referring now to FIG. 1, an example substrate processing system 100 for performing etching using RF plasma is shown. The substrate processing system 100 includes a processing chamber 102 that encloses other components of the substrate processing system 100 and contains the RF plasma. The substrate processing system 100 further includes an upper electrode 104 and an electrostatic chuck (ESC) 106. During operation, a substrate 108 is arranged on the ESC 106.

For example only, the upper electrode 104 may include a showerhead 109 that introduces and distributes process gases. The showerhead 109 may include a stem portion including one end connected to a top surface of the processing chamber. A base portion is generally cylindrical and extends radially outwardly from an opposite end of the stem portion at a location that is spaced from the top surface of the processing chamber. A substrate-facing surface or faceplate of the base portion of the showerhead includes a plurality of holes through which process gas or purge gas flows. Alternately, the upper electrode 104 may include a conducting plate and the process gases may be introduced in another manner.

The ESC 106 includes a conductive baseplate 110 that acts as a lower electrode. The baseplate 110 supports a heating plate 112, which may correspond to a ceramic multi-zone heating plate. A thermal resistance layer 114 may be arranged between the heating plate 112 and the baseplate 110. The baseplate 110 may include one or more coolant channels 116 for flowing coolant through the baseplate 110.

An RF generating system 120 generates and outputs an RF voltage to one of the upper electrode 104 and the lower electrode (e.g., the baseplate 110 of the ESC 106). The other one of the upper electrode 104 and the baseplate 110 may be DC grounded, AC grounded or floating. For example only, the RF generating system 120 may include an RF voltage generator 122 that generates the RF voltage that is fed by a matching and distribution network 124 to the upper electrode 104 or the baseplate 110. In other examples, the plasma may be generated inductively or remotely.

A gas delivery system 130 includes one or more gas sources 132-1, 132-2, . . . , and 132-N (collectively gas sources 132), where N is an integer greater than zero. The gas sources supply one or more precursors and mixtures thereof. The gas sources may also supply purge gas. Vaporized precursor may also be used. The gas sources 132 are connected by valves 134-1, 134-2, . . . , and 134-N (collectively valves 134) and mass flow controllers 136-1, 136-2, . . . , and 136-N (collectively mass flow controllers 136) to a manifold 140. An output of the manifold 140 is fed to the processing chamber 102. For example only, the output of the manifold 140 is fed to the showerhead 109.

A field condition controller 142 controls a condition (e.g., temperature, ion density) in a zone or field of the processing chamber 102. The field condition controller 142 may be connected to a plurality of control elements (CEs) 144 arranged in the processing chamber 102. For example, the CEs 144 may include, but are not limited to, respective macro CEs corresponding to each zone in a multi-zone heating plate and/or an array of micro CEs disposed across multiple zones of a multi-zone heating plate as described in more detail in FIGS. 2A and 2B. The CEs 144 may be thermal control elements arranged in the heating plate 112, and the field condition controller 142 may be used to control the CEs 144 to control a temperature of the ESC 106 and the substrate 108. Alternatively, the CEs 144 may be RF antennas, and the field condition controller 142 may be used to control the CEs 144 to control an ion density within the processing chamber 102. As discussed in more detail below, the field condition controller 142 may control the plurality of CEs 144 based on a setpoint value of a field condition and predetermined profiles (e.g., power percentages) corresponding to various setpoint values.

The field condition controller 142 may communicate with a coolant assembly 146 to control coolant flow through the channels 116. For example, the coolant assembly 146 may include a coolant pump and reservoir. The field condition controller 142 operates the coolant assembly 146 to selectively flow the coolant through the channels 116 to cool the ESC 106.

A valve 150 and pump 152 may be used to evacuate reactants from the processing chamber 102. A system controller 160 may be used to control components of the substrate processing system 100. A robot 170 may be used to deliver substrates onto, and remove substrates from, the ESC 106. For example, the robot 170 may transfer substrates between the ESC 106 and a load lock 172.

An ellipsometer 180 may be used to measure a thickness of a film 182 on the substrate 108. The film 182 may be a masking material, such as photoresist or silicon nitride, which protects the substrate 108 from an etchant during etching. The ellipsometer 180 may emit a light 184 toward the film 182, measure a diffraction of the light 184, and determine the film thickness based on the diffraction of the light 184. The ellipsometer 180 may determine the film thickness at various locations on the substrate 108 and output the film thicknesses to a calibration controller 190.

The calibration controller 190 may determine an etch rate of the film 182 at a particular condition (e.g., temperature, ion density) in a field of the processing chamber 102 based on (i) a difference between a first film thickness before the substrate 108 is etched and a second film thickness after the substrate 108 is etched. For example, the calibration controller 190 may divide this difference by the corresponding etching period to obtain the etch rate of the film 182 at that condition. The calibration controller 190 may determine the etch rates at various locations on the substrate 108. In addition, as discussed in more detail below, the calibration controller 190 may determine non-uniformities in the etch rates and, based on the non-uniformities, adjust the profiles used by the field condition controller 142 to control the plurality of CEs 144. The calibration controller 190 may use the non-uniformities determined for a particular field condition to adjust the profiles used to control that field condition. For example, if the calibration controller 190 determines the non-uniformities in the etch rates due to temperature, the calibration controller 190 may use the non-uniformities to adjust the profiles used to control the temperature. Similarly, if the calibration controller 190 determines the non-uniformities in the etch rates due to ion density, the calibration controller 190 may use the non-uniformities to adjust the profiles used to control the ion density. The calibration controller 190 may include memory such flash memory and/or optical storage media, such as a CD, DVD, or Blu-ray Disc, which may store instructions executed by the calibration controller 190 and/or data generated by the calibration controller 190.

Referring now to FIGS. 2A, 2B, and 2C, an example ESC 200 is shown. A field condition controller 204 communicates with the ESC 200 via one or more electrical connections 208. For example, the electrical connections 208 may include, but are not limited to, connections for selectively controlling macro CEs 212-1, 212-2, 212-3, and 212-4, referred to collectively as macro CEs 212, and/or micro CEs 216 and connections for receiving field condition feedback from one or more field condition sensors 220. In one example, the macro CEs 212 and the micro CEs 216 are macro thermal control elements (TCEs) and micro TCEs, respectively, the field condition sensors 220 are temperature sensors, and the field condition controller 204 receive temperature feedback from the field condition sensors 220. In another example, the macro CEs 212 and the micro CEs 216 are micro RF antennas and macro RF antennas, respectively, the field condition sensors 220 are ion density sensors, and the field condition controller 204 receives ion density feedback from the field condition sensors 220.

As shown, the ESC 200 is a multi-zone ESC including zones 224-1, 224-2, 224-3, and 224-4, referred to collectively as zones 224. Although shown with the four concentric zones 224, in embodiments the ESC 200 may include one, two, three, or more than four of the zones 224. The shapes of the zones 224 may vary. Each of the zones 224 includes a respective one of the field condition sensors 220 and a respective one of the macro CEs 212.

In the example shown, the ESC 200 further includes a baseplate 228 including coolant channels 232, a thermal resistance layer 236 formed on the baseplate 228, and a multi-zone ceramic heating plate 240 formed on the thermal resistance layer 236. The heating plate 240 may include multiple bonded layers, including a first layer 244 as shown in FIG. 2B and a second layer 248 as shown in FIG. 2C. The first layer 244 includes the macro CEs 212 and the second layer 248 includes the plurality of micro CEs 216. As shown, the macro CEs 212 and the first layer 244 are shown arranged above the micro CEs 216 and the second layer 248. However, in various embodiments, the macro CEs 212 and the first layer 244 may be arranged below the micro CEs 216 and the second layer 248.

The field condition controller 204 controls the macro CEs 212 and the micro CEs 216 according to a desired setpoint value for a field condition (e.g., temperature, ion density). For example, the temperature controller 204 may receive (e.g., from the system controller 160 as shown in FIG. 1) a setpoint temperature for one or more of the zones 224. In another example, the temperature controller 204 may receive (e.g., from the system controller 160 as shown in FIG. 1) a setpoint ion density for one or more of the zones 224. For example only, the temperature controller 204 may receive a same setpoint value for all or some of the zones 224 and/or different respective setpoint values for each of the zones 224. The setpoint values for each of the zones 224 may vary across different processes and different steps of each process.

The field condition controller 204 controls the macro CEs 212 for each of the zones 224 based on the respective setpoint values and field condition feedback provided by the sensors 220. For example, the field condition controller 204 individually adjusts power (e.g., current) provided to each of the macro CEs 212 to achieve the setpoint values. The macro CEs 212 may each include a single resistive coil or other structure schematically represented by the dashed lines of FIG. 2B. Accordingly, adjusting one of the macro CEs 212 affects the condition (e.g., temperature) of the entire respective zone 224. The sensors 220 may provide field condition feedback for only a local portion of each of the zones 224. For example only, the sensors 220 may be positioned in a portion of each zone 224 previously determined to have a closest correlation to an average value of the condition of the zone 224.

Conversely, the field condition controller 204 may individually control each of the micro CEs 216 to locally adjust conditions of the zones 224. For example, although each micro CE 216 may be located entirely within one of the zones 224, adjusting a thermal output of any one of the micro CEs 216 may have a thermal impact across multiple zones 224 and localities of the heating plate 240. Accordingly, one or more of the micro CEs 216 may be selectively activated and/or deactivated to further adjust temperatures of the zones 224. In another example, although each micro CE 216 may be located entirely within one of the zones 224, adjusting an RF signal output of any one of the micro CEs 216 may have an ion density impact across multiple zones 224 and localities of the heating plate 240. Accordingly, one or more of the micro CEs 216 may be selectively activated and/or deactivated to further adjust ion densities of the zones 224.

Chamber condition auto-correction systems and methods according to the principles of the present disclosure selectively activate one or more of the micro CEs 216 during process steps to compensate for non-uniformities in the zones 224 of the heating plate 240. For example, the non-uniformities may cause, for a given temperature setpoint, non-uniform temperatures across a respective zone 224. For example, if a setpoint for the zone 224-1 is set to 50° C., actual temperatures in the zone 224-1 may vary (e.g., from 47° C. to 53° C., including local temperatures of 47° C., 48° C., 49° C., etc.), and the temperature feedback provided by the sensor 220 may only indicate an average or nominal temperature for the zone 224-1. Accordingly, adjusting a power percentage of the macro TCE 212-1 to a level corresponding to 50° C. may not result in the entirety of the zone 224-1 being maintained at the desired 50° C.

The non-uniformity of the field conditions across the zones 224 may scale according to a power provided to the respective macro CE 212. In other words, as the setpoint field condition of the zone 224 increases or decreases, the magnitude of the field non-uniformities in the zone 224 also increases or decreases. The one or more of the micro CEs 216 are therefore activated to achieve any desired setpoint field condition for the entire zone 224 as described below in more detail. Non-uniformities along an annular path defined by each of the zones 224 may be referred to as azimuthal non-uniformities (i.e., non-uniformity from one point along the annular path to another point along the annular path). For example only, each of the micro CEs 216 may be identified by a radius r (i.e., a distance from a centerpoint 252) and an angle θ, which corresponds to an azimuthal position within the zone 224. Although azimuthal non-uniformities are discussed herein, non-uniformities can be defined relative to arbitrary shapes within a processing chamber.

Figure 3:
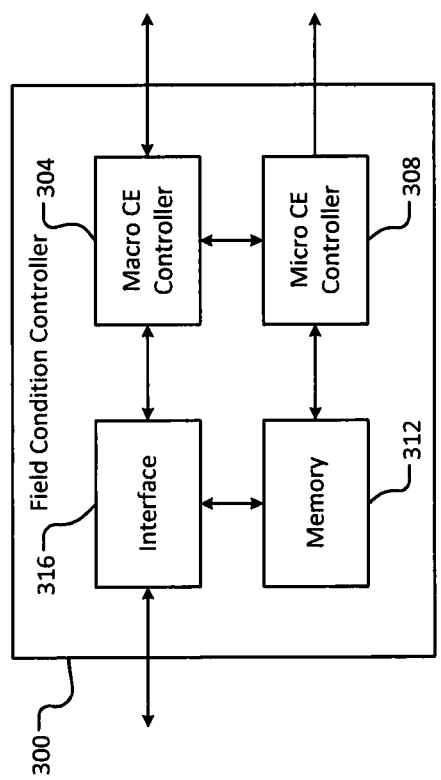
FIG. 3 is an example field condition controller for a processing chamber according to the principles of the present disclosure.

Referring now to FIG. 3 and with reference to FIGS. 2A, 2B, and 2C, a field condition controller 300 includes a macro CE controller 304 and a micro CE controller 308, memory 312, and an interface 316 for communicating with, for example, the system controller 160 as shown in FIG. 1. For example, the field condition controller 300 receives setpoint values of a field condition (e.g., temperature, ion density) from the system controller 160 via the interface 316. The interface 316 provides the setpoint values to the macro CE controller 304. The setpoint values may include a single setpoint value for every zone 224 and/or different setpoint values for each of the respective zones 224.

The macro CE controller 304 controls the macro CEs 212 according to the received setpoint or setpoints. For example, the macro CE controller 304 may adjust each macro CE 212 to the corresponding setpoint, minus an offset. The offset may be the same for each zone 224 or different for one or more of the zones 224. The offset may be, for example only, 5° C. or another predetermined value. In embodiments, the offset may be predetermined based on observed temperature non-uniformities in each of the zones 224. For example, if a minimum observed temperature in a zone 224 for a given setpoint is 2° C. less than the setpoint, the offset may be set at 2° C. or greater than 2° C. In other words, the offset may be set to greater than or equal to a difference between the setpoint and a lowest observed value of the corresponding field condition in the zone 224 that is less than the setpoint.

In this manner, if the setpoint is 50° C. and the offset is 5° C., the macro CE 212 for a zone 224 can be controlled to 45° C. The micro CEs 216 can then be controlled to achieve the setpoint of 50° C. throughout the zone 224, thereby compensating for temperature non-uniformities in the zone 224. For example, some of the micro CEs 216 may be controlled to increase the temperature in a portion of the zone 224 by 5° C. (e.g., in a portion of the zone 224 that was observed to correlate exactly to the setpoint temperature). Conversely, others of the micro CEs 216 may be controlled to increase the temperature in another portion of the zone 224 by 7° C. (e.g., in a portion of the zone 224 that was observed to correlate to 2° C. less than the setpoint temperature). Still others of the micro CEs 216 may be controlled to increase the temperature in another portion of the zone 224 by 3° C. (e.g., in a portion of the zone 224 that was observed to correlate to 2° C. more than the setpoint temperature). Accordingly, whether the field non-uniformities correspond to field conditions less than the setpoint or greater than the setpoint, the micro CEs 216 can be controlled to achieve the setpoint value for the zone 224 to compensate for the non-uniformities.

Previously-determined profiles (e.g., power percentages) of each of the micro CEs 216 for each setpoint temperature received for the zones 224 are stored in the memory 312. For example only, the memory 312 may include non-volatile memory such as flash memory. For example, each of the micro TCEs 216 may be controlled to contribute from 0° C. (at 0% power) to 10° C. (at 100% power) to localities of each of the zones 224. Accordingly, when the macro CE controller 304 receives setpoint values for one or more of the zones 224 and controls the corresponding macro CEs 212 based on the setpoints (e.g., to a setpoint minus the offset), the micro CE controller 308 may also receive the setpoint values (e.g., from the macro CE controller 304 and/or directly from the interface 316). The micro CE controller 308 can then retrieve respective profiles for each of the micro CEs 216 and control the micro CEs 216 accordingly. In this manner, the micro CE controller 308 can control the micro CEs 216 to automatically compensate for field non-uniformities across each of the zones 224 for any setpoint value.

In various embodiments, the profiles may include different power percentages, for each micro CE 216, for each setpoint, and/or may include a single percentage value that is automatically adjusted according to the setpoint value. For example, if a temperature non-uniformity is observed to be a percentage of the setpoint (e.g., 5% greater than the setpoint), then the power percentage for a given setpoint may correspond to a baseline percentage P multiplied by the setpoint. In other embodiments, the profiles may simply include different temperature demands (e.g., from 0-10° C.) for each of the micro TCEs 216, for each setpoint.

In various embodiments, the profiles may include different reference values for each micro CE 216 and each setpoint value for the macro CEs 212, and the micro CE controller 308 may control the micro CEs 216 using closed-loop feedback. For example, if the macro CEs 212 and the micro CEs 216 are TCEs, the micro CE controller 308 may determine an actual temperature at the location of each micro CE 216 and control the micro CEs 216 to minimize a difference between reference temperatures and the actual temperatures. The micro CE controller 308 may determine the actual temperature at the location of each micro CE 216 based on the resistance of each micro CE 216 and a function or mapping of micro TCE resistance to micro TCE temperature. The micro CE controller 308 may determine the resistance of each micro CE 216 based on a voltage differential across each micro CE 216 and a current supplied to each micro CE 216. For example, the micro CE controller 308 may divide the voltage differential across one of the micro CEs 216 by a current supplied to that one of the micro CEs 216 to obtain the resistance of that one of the micro CEs 216.

The profiles for each micro CE 216 may be based on (i) relationships between control setpoints for each of the macro CEs 212 and corresponding field condition responses in each of the zones 224, and (ii) relationships between a power percentage provided to each of the micro CEs 216 and corresponding field condition responses (e.g., local changes in temperature) in each of the zones 224. In other words, for (i), field non-uniformities in one of the zones 224 for each setpoint may be known/predetermined. Conversely, for (ii), the field condition response of every one of the micro CEs 216, at all power levels, on surrounding portions of each of the zones 224 may be known/predetermined. Accordingly, for each setpoint (and the corresponding known field non-uniformities in each of the zones 224 when the macro CEs 212 are controlled to each setpoint), a power percentage to be provided to each micro CE 216 in a region including one or more temperature non-uniformities can be calculated (based on the known temperature response caused by each micro CE 216 in that region) and stored in the memory 312.

A simplified example is described with reference to FIG. 4. Those skilled in the art can appreciate that the values in the example are chosen merely for illustrative purposes. For example only, a region 400 of a heating plate 402 may include a single temperature non-uniformity at 404 in a zone 408. For example only, for a setpoint of 50° C., the non-uniformity 404 may correspond to a temperature of 46° C. Assuming an offset of 5° C. (and therefore a controlled temperature of 45° C.), a default power percentage to each of micro TCEs 412 to achieve the setpoint of 50° C. may be 10%. However, the micro TCE 412 nearest to the non-uniformity 404 may be provided with 50% power to compensate for the 4° C. difference of the non-uniformity 404 based on a known temperature response of that micro TCE 412. Conversely, power to other micro TCEs 412 may be adjusted downward to compensate for the thermal response of the micro TCE 412 powered at 50% on other areas of the zone 408 and an adjacent zone 416. In other words, nearby micro TCEs 412 may be controlled at a percentage lower than the default percentage to avoid increasing the temperature above the setpoint.

Figure 4:
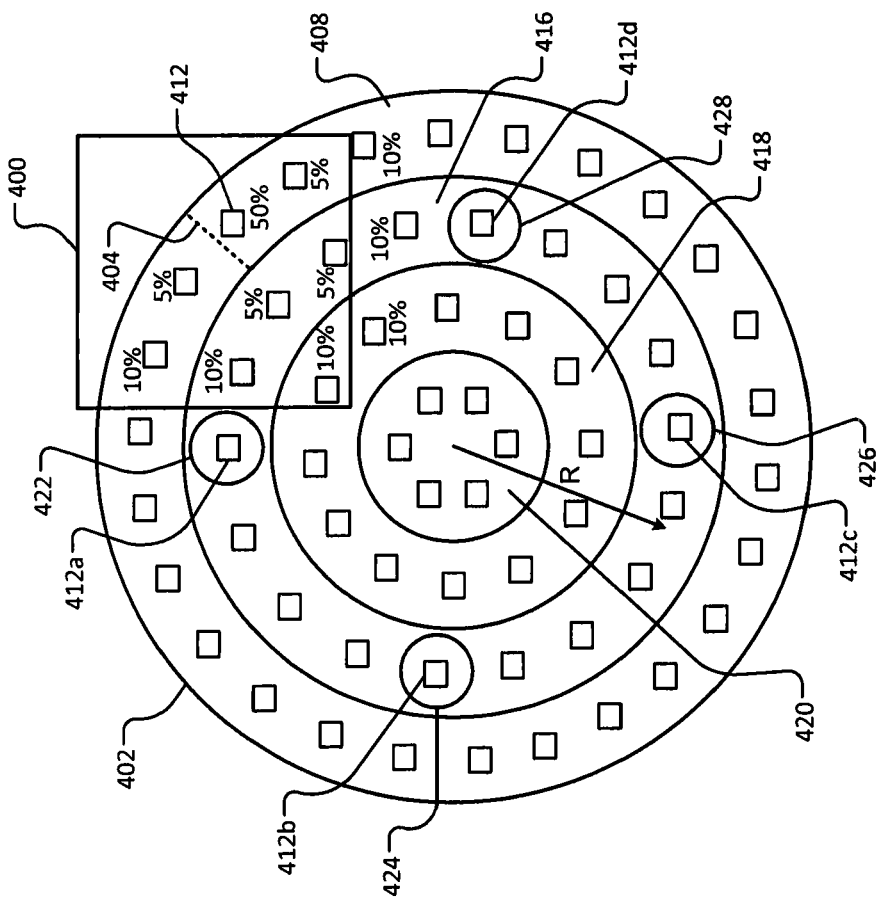
FIG. 4 illustrates an example field non-uniformity in a region of an electrostatic chuck according to the principles of the present disclosure.

Those skilled in the art can appreciate that the example of FIG. 4 is only one possible, simplified relationship between a given setpoint, temperature non-uniformities, and the control of the micro TCEs 412. The overall relationships may be complex and various temperature non-uniformities may require multiple ones of the micro TCEs 412 to be adjusted upward or downward, based on the profiles stored in the memory 312, to automatically achieve a uniform setpoint temperature throughout the zones of the ESC.

Figure 5:
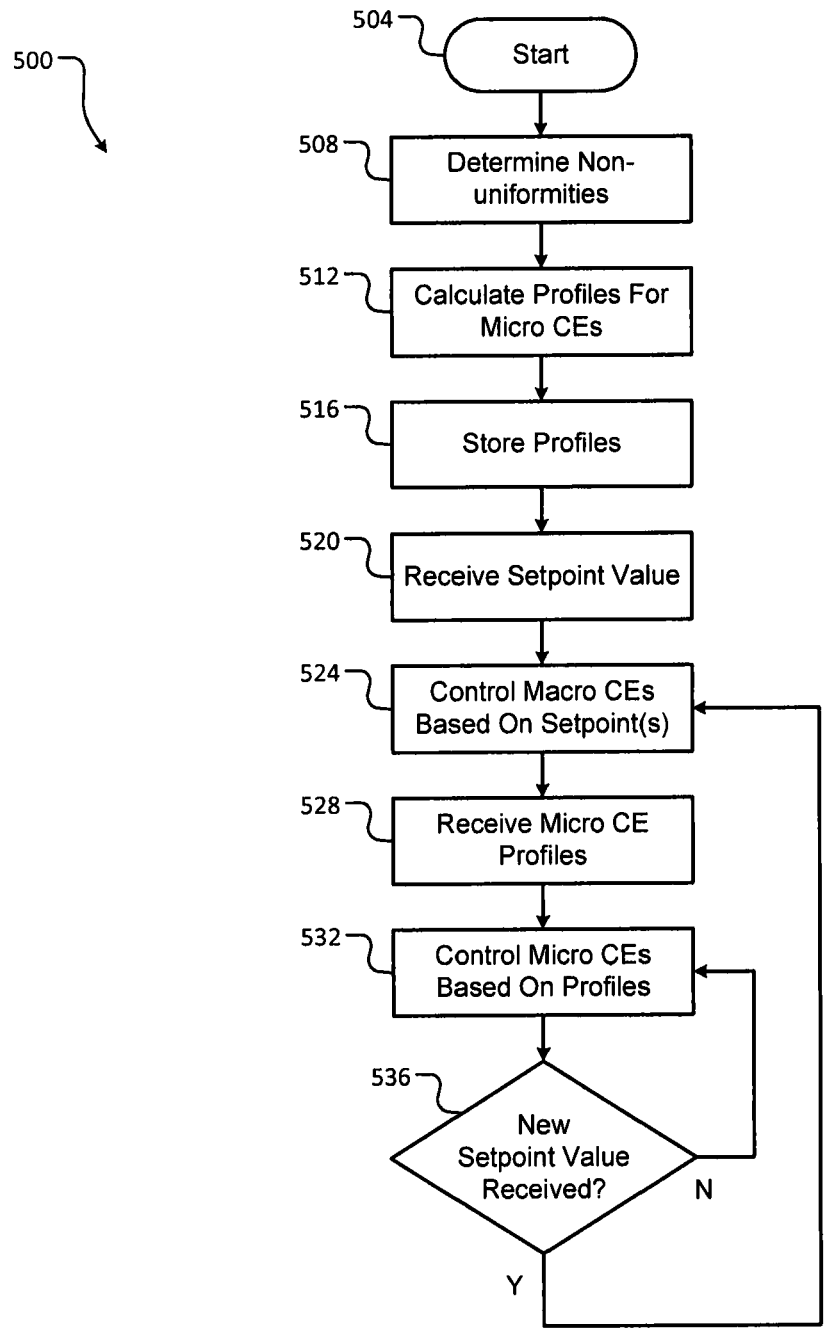
FIG. 5 illustrates steps of an example chamber condition auto-correction method according to the principles of the present disclosure.

Referring now to FIG. 5, an example chamber condition auto-correction method 500 begins at 504. At 508, non-uniformities in a condition (e.g., temperature, ion density) within zones or fields of a wafer processing chamber are determined. For example, the field non-uniformities may correspond to temperature non-uniformities in a multi-zone heating plate of an ESC. In another example, field non-uniformities may correspond to ion density non-uniformities in the processing chamber. At 512, profiles of power percentages and/or field condition demands for each micro CE in the processing chamber are calculated based on the field non-uniformities. For example, the power percentages and/or field condition demands may correspond to a desired field condition response provided by each micro CE to compensate for the field non-uniformities. The micro CEs may be micro TCEs that control the temperature within zones or fields of the chamber. Alternatively, the micro CEs may be micro RF antennas that control the ion density with zones or fields of the chamber. At 516, profiles for each of the micro CEs are stored in memory based on the calculated power percentages and/or field condition demands.

At 520, a field condition controller receives a desired setpoint value for a condition (e.g., temperature, ion density) or multiple setpoint values for the condition for respective zones of the processing chamber. At 524, the field condition controller controls macro CEs corresponding to the zones or fields of the processing chamber based on the respective setpoint values as received. For example, the field condition controller may control the macro CEs to a control setpoint that corresponds to the desired setpoint value minus an offset. The macro CEs may be macro TCEs that control the temperature within zones or fields of the chamber. Alternatively, the macro CEs may be macro RF antennas that control the ion density with zones or fields of the chamber.

At 528, the field condition controller retrieves, from the memory, the profiles for each of the micro CEs. At 532, the temperature controller controls the micro TCEs based on the profiles retrieved from memory. In one example, the profiles indicate power percentages or field condition demands, and the field condition controller controls the micro CEs based on the profiles in an open-loop manner. In another example, the profiles indicate a reference value for a field condition (e.g., temperature, ion density), and the field condition controller controls the micro CEs based on the profiles in a closed-loop manner. In the latter example, the field condition controller controls each micro CE based on a difference between the reference value and an actual value. At 536, the method 500 determines whether the field condition controller received a new desired setpoint field condition. If true, the method 500 continues to 524. If false, the method 500 continues to 532.

Figure 6:
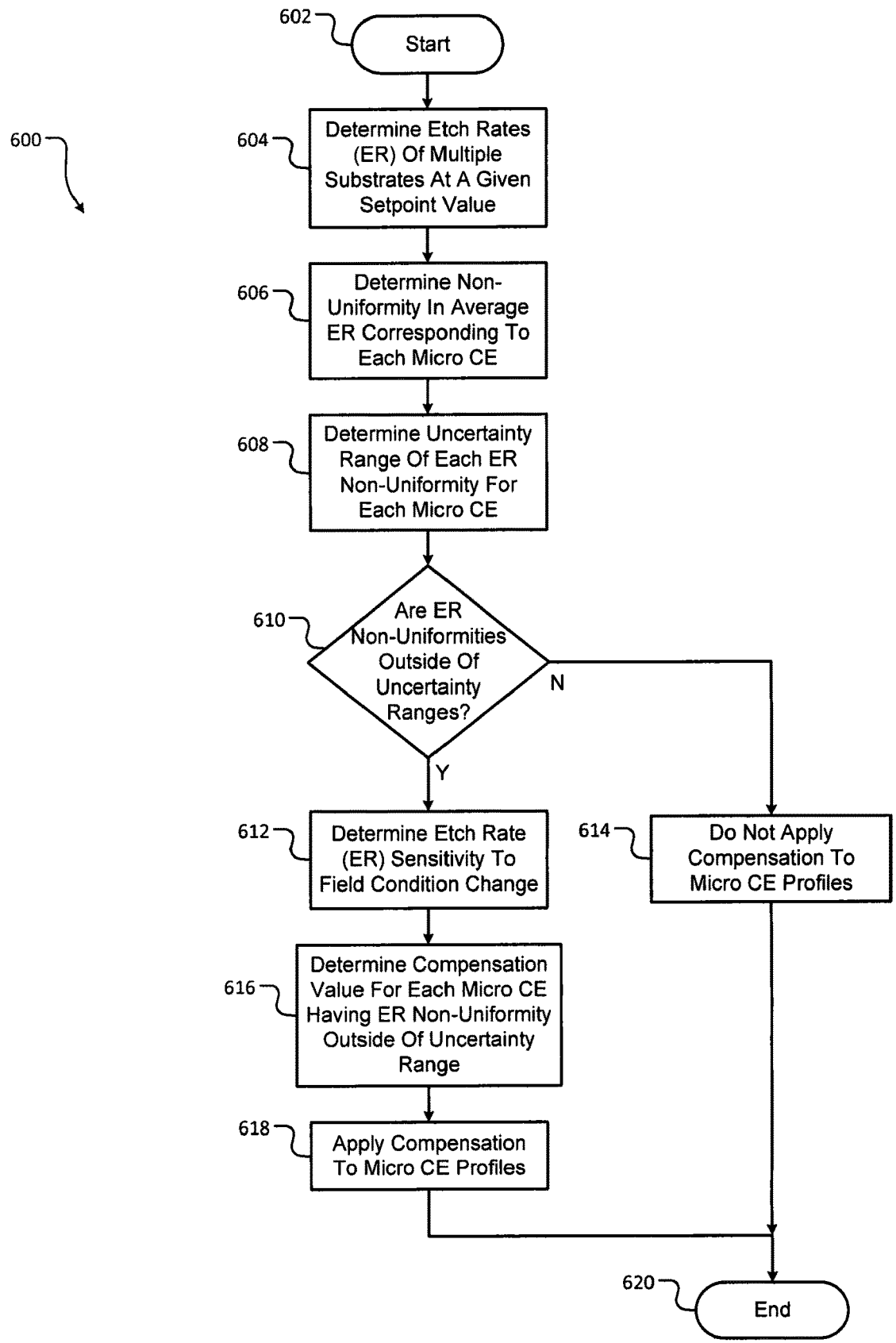
FIG. 6 illustrates steps of an example field non-uniformity determination and compensation method according to the principles of the present disclosure.

Referring now to FIG. 6, an example field non-uniformity determination and compensation method 600 begins at 602. The method 600 is described in the context of the controllers of FIG. 1. However, the particular controllers that perform the steps of the method 600 may be different than the controllers mentioned below and/or the method may be implemented apart from the controllers of FIG. 1.

At 604, the calibration controller 190 determines the etch rates of multiple (e.g., 4) substrates at a given setpoint value of a field condition (e.g., temperature, ion density). For example only, referring again to FIG. 4, the setpoint temperature for the zone 408, the zone 416, a zone 418, and a zone 420 may be adjusted to 50° C. In various implementations, the setpoint values for each of the zones 408-420 may be different from each other. For example, the setpoint temperatures may gradually decrease from the zone 408 to the zone 420 (referred to as "center hot") or the setpoint temperatures may gradually decrease from the zone 420 to the zone 408 (referred to as "edge hot"). Although the calibration controller 190 determines etch rates in this example, the calibration controller 190 may determine another substrate processing parameter that is sensitive to a field condition. In addition, the setpoint value may be adjusted to a value at which the substrate processing parameter is sensitive to the field condition.

As noted above in the discussion of FIG. 1, the calibration controller 190 may determine the etch rate of a film on a substrate at various locations on the substrate corresponding to various ones of the micro CEs. For example, the calibration controller 190 may determine the etch rates in a region 422 in which a micro CE 412a is disposed, in a region 424 in which a micro CE 412b is disposed, in a region 426 in which a micro CE 412c is disposed, in a region 428 in which a micro CE 412d is disposed. In this manner, for each of the multiple (e.g., 4) substrates, the calibration controller 190 determines the etch rate in each region in which a micro CE is disposed.

Referring again to FIG. 6, at 606, the calibration controller 190 determines a non-uniformity in an etch rate corresponding to each of the micro CEs in a processing chamber relative to an average etch rate of at least a portion of micro CEs in the processing chamber. To accomplish this, the calibration controller 190 may first determine an average value of the multiple (e.g., 4) etch rates at each micro CEs for the multiple (e.g., 4) substrates. For example, referring again to FIG. 4, the calibration controller 190 may determine an average value $\mu_{422}$ of the multiple (e.g., 4) etch rates of the region 422 in which the micro CE 412a is disposed, an average value $\mu_{424}$ of the etch rates of the region 424 in which the micro CE 412b is disposed, an average value $\mu_{426}$ of the etch rates of the region 426 in which the micro CE 412c is disposed, and an average value $\mu_{428}$ of the etch rates of the region 428 in which the micro CE 412d is disposed.

The calibration controller 190 may then determine a radial average of the average values of the etch rates corresponding to each of the micro TCEs. Alternatively, the calibration controller 190 may determine an average value of the average etch rates corresponding to the micro TCEs arranged in an arbitrary shape across the wafer. In one example, the calibration controller 190 may determine a radial average $\mu_{rad\_avg}$ of the average etch rates $\mu_{422}$-$\mu_{428}$ corresponding to the micro CEs 412a-412d, respectively, using the following equation $$\mu_{rad\_avg} = \tfrac{1}{4}(\mu_{422}+\mu_{424}+\mu_{426}+\mu_{428}) \tag{1}$$

In various implementations, the calibration controller 190 may determine a radial average of average etch rates corresponding to all of the micro CEs disposed within the zone 416 (and/or at a radius R from the center of the heating plate 402). Similarly, the calibration controller 190 may determine radial averages of average etch rates corresponding to all of the micro CEs disposed within the zone 408, the zone 418, and the zone 420 (and/or at corresponding radii). In various implementations, micro CEs may be location at different radii within each of the zones 408, 416, 418, and 420, in which case the calibration controller 190 may determine multiple radial averages for each of the zones 408, 416, 418, and 420.

The calibration controller 190 may then determine the non-uniformity of the average etch rate corresponding to each of the micro CEs in the processing chamber relative to the corresponding radial average. For example, the calibration controller 190 may determine a non-uniformity $\mu_{non-uniformity\ of\ 422}$ of the average etch rate in the region 422 in which the micro CE 412a is disposed using the following equation $$\mu_{non-uniformity\ of\ 422} = (\mu_{422}-\mu_{rad\_avg}) \tag{2}$$

In a similar manner, the calibration controller 190 may determine non-uniformities of the average etch rates in the regions 424, 426, and 428 in which the micro CEs 412b, 412c, and 412d are disposed.

Referring again to FIG. 6, at 608, the calibration controller 190 determines an uncertainty range of each of the etch rate non-uniformities for each of the micro CEs (or regions in which the micro CEs are disposed). To accomplish this, the calibration controller 190 may first determine a variance of the etch rate non-uniformity of each of the micro CEs relative to the average etch rate non-uniformities of at least a portion of the micro CEs in a heating plate. For example, referring again to FIG. 4, the calibration controller 190 may determine a variance $\sigma_{422}^2$ of the etch rate non-uniformity $\mu_{non-uniformity\ of\ 422}$ in the region 422 in which the micro CE 412a is disposed using the following equation $$\sigma_{422}^2 = \tfrac{1}{4}\Sigma_{i=0}^{i=N}(z_{422,i}-\mu_{422}) \tag{3}$$

where $z_{422,i}$ is the etch rate in the region 422 for each substrate i of the N (e.g., 4) substrates and $\mu_{422}$ is the average value of the N (e.g., 4) etch rates in the region 422 corresponding to the N substrates. In a similar manner, the calibration controller 190 may determine variances $\sigma_{424}^2$, $\sigma_{426}^2$, and $\sigma_{428}^2$ of the regions 424, 426, 428 in which the micro CEs 412b, 412c, and 412d are disposed.

Then, for at least a portion of the micro CEs in the processing chamber, the calibration controller 190 may determine a variance for the average value of the etch rate non-uniformities. For example, the calibration controller 190 may determine may determine a variance $\sigma_{rad\_avg}^2$ of the radial average of the etch rates of the micro CEs 412a, 412b, 412c, and 412d using the following equation $$\sigma_{rad\_avg}^2 = \frac{1}{4^2}(\sigma_{422}^2 + \sigma_{424}^2 + \sigma_{426}^2 + \sigma_{428}^2) \tag{4}$$

Then, for each of the micro CEs in the processing chamber, the calibration controller 190 may determine a variance of the non-uniformity corresponding to the micro CE relative to the corresponding variance of the radial average of the etch rates. For example, the calibration controller 190 may determine may determine a variance of residual $\sigma_{non-uniformity\ of\ 422}^2$ of the region 422 in which the micro CE 412a is disposed using the following equation $$\sigma_{residual\ of\ 422}^2 = \sigma_{422}^2 + \sigma_{rad\_avg}^2 \qquad (5)$$

In a similar manner, the calibration controller 190 may determine residual variances $\sigma_{residual\ of\ 424}^2$, $\sigma_{residual\ of\ 426}^2$, and $\sigma_{residual\ of\ 428}^2$ of the regions 424, 426, 428 in which the micro CEs 412b, 412c, and 412d are disposed.

The calibration controller 190 may then determine the uncertainty range of each of the etch rate non-uniformities of the micro CEs (or regions in which the micro CEs are disposed) based on the residual variances. For example, the calibration controller 190 may determine the square root of the residual variance $\sigma_{residual\ of\ 422}^2$ of the region 422 in which the micro CE 412a is disposed in order to obtain a standard deviation. The calibration controller 190 may then define the uncertainty range of the etch rate non-uniformity of the micro CE 412a (or the region 422) as a range between positive and negative values of a multiple of the standard deviation (e.g., $\pm 3\sigma_{residual\ of\ 422}$). The calibration controller 190 may define the uncertainty ranges of the etch rate non-uniformities of the micro CEs 412b, 412c, and 412d in a similar manner.

Referring again to FIG. 6, at 610, the calibration controller 190 determines whether any of the etch rate non-uniformities of the micro CEs in a heating plate are outside of corresponding uncertainty ranges. For example, briefly referring again to FIG. 4, the calibration controller 190 may determine whether the non-uniformity $\mu_{non-uniformity\ of\ 422}$ of the average etch rate in the region 422 satisfies the following condition $$|\mu_{non-uniformity\ of\ 422}| > 3\sigma_{residual\ of\ 422} \qquad (6)$$

In a similar manner, the calibration controller 190 may determine whether the non-uniformities of the average etch rates in the regions 424, 426, and 428 are outside of corresponding certainty ranges. If any of the etch rate non-uniformities are outside of corresponding uncertainty ranges, the calibration controller 190 continues at 612. Otherwise, the calibration controller 190 continues at 614.

At 612, the calibration controller 190 determines a sensitivity of etch rates to changes in a field condition (e.g., temperature, ion density). For example, the calibration controller 190 may determine a first etch rate corresponding to each micro CE in the processing chamber when a first substrate is etched at a first setpoint value of the field condition. In addition, the calibration controller 190 may determine a second etch rate corresponding to each micro CE in the processing chamber when second substrate that is etched at a second setpoint value of the field condition that is different from the first setpoint value. Then, for each of the micro CEs, the calibration controller 190 may divide the difference between the first and second etch rates by the difference between the first and second setpoint values to obtain the etch rate temperature sensitivity at that micro CE. The sensitivity of the etch rates to the field condition may correspond to a given setpoint value or a range of setpoint values. For example, the temperature sensitivity of silicon nitride etch rates at 50° C. may be 1.5 nanometers per ° C.

At 616, the calibration controller 190 determines a compensation value for each micro TCE in the processing chamber having an etch rate non-uniformity that is outside of the corresponding uncertainty range. To accomplish this, the calibration controller 190 may first determine a field non-uniformity corresponding to each of the micro CEs (or regions in which the micro CEs are disposed). For example, the calibration controller 190 may divide the etch rate non-uniformity corresponding to a micro CE by a corresponding etch rate field condition sensitivity to obtain the field non-uniformity corresponding to that micro CE. The calibration controller 190 may then set the compensation value for each micro CE equal to a negative value of the field non-uniformity determined for that micro CE.

At 618, the calibration controller 190 applies a compensation to profiles used by a micro CE controller to control micro CEs based on a setpoint value of the field condition. For example, referring again to FIGS. 2C and 3, the calibration controller 190 may apply a compensation to profiles used by the micro CE controller 308 to control the micro CEs 216 based on a setpoint value. The calibration controller 190 may apply the compensation by adding the compensation value for each micro CE to all of the field condition demands in the profile for that micro CE. Alternatively, the compensation value may be converted into a compensation power percentage, and the calibration controller 190 may apply the compensation by adding the compensation power percentage for each micro CE to all of the power percentages in the profile for that micro CE. The micro CE controller 308 may use the adjusted profiles to control the micro CEs 216 during etching, deposition, and/or other substrate processing techniques.

Referring again to FIG. 6, as indicated above, the calibration controller 190 continues at 614 when all of the etch rate non-uniformities of the micro CEs in the processing chamber are within corresponding uncertainty ranges. At 614, the calibration controller 190 does not apply a compensation to the profiles used by a micro CE controller to control micro CEs. The method 600 ends at 620.

In the above example, the calibration controller 190 determines the etch rate non-uniformities of all of the micro CEs in a heating plate relative to other micro CEs arranged along a common radius. In this regard, the calibration controller 190 determines azimuthal non-uniformities in the etch rates. In a similar manner, the calibration controller 190 may determine etch rate non-uniformities in any convenient set of contiguous regions or arbitrary shapes covering an area where the micro CEs are disposed. For example, the calibration controller 190 may determine radial non-uniformities in the etch rates. The calibration controller 190 may determine the radial non-uniformities in the etch rates relative to, for example, other etch rates within a concentric zone of a heating plate. The calibration controller 190 may then determine field non-uniformities based on the etch rate non-uniformities, and adjust the profiles used by a micro CE controller to control micro CEs to compensate for the field non-uniformities.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A OR B OR C), using a non-exclusive logical OR, and should not be construed to mean "at least one of A, at least one of B, and at least one of C." It should be understood that one or more steps within a method may be executed in different order (or concurrently) without altering the principles of the present disclosure.

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RE) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

None of the elements recited in the claims are intended to be a means-plus-function element within the meaning of 35 U.S.C. § 112(f) unless an element is expressly recited using the phrase "means for," or in the case of a method claim using the phrases "operation for" or "step for."

What is claimed is:

1. A system for controlling a wafer processing chamber, the system comprising:
 a plurality of sets of first thermal control elements arranged in respective zones of an electrostatic chuck (ESC) of the wafer processing chamber, wherein each of the sets of first thermal control elements is separately controllable to adjust a temperature of one of the respective zones;
 a plurality of second thermal control elements distributed throughout each of the respective zones, wherein each of the second thermal control elements is separately controllable from the first thermal control elements and others of the second thermal control elements;
 memory that stores a plurality of profiles of respective ones of the plurality of second thermal control elements;
 a first controller that:
  determines, for a first substrate, first respective etch rates of each of the plurality of second thermal control elements at predetermined setpoints of the plurality of sets of first thermal control elements;
  determines, for a second substrate, second respective etch rates of each of the plurality of second thermal control elements at the predetermined setpoints of the plurality of sets of first thermal control elements;
  determines, using the first and second respective etch rates as determined for the first substrate and the second substrate at the predetermined setpoints of the plurality of sets of first thermal control elements,
   (i) a first average etch rate of the first and second respective etch rates for the first substrate and the second substrate for a first one of the plurality of second thermal control elements, (ii) a second average etch rate of the first and second respective etch rates for the first substrate and the second substrate for a second one of the plurality of second thermal control elements, and (iii) a third average etch rate of the first average etch rate and the second average etch rate;

determines non-uniformities for each of the first and second average etch rates using the first, second, and third average etch rates;

adjusts at least one of the plurality of profiles based on the non-uniformities in the first and second average etch rates and a sensitivity of the first and second respective etch rates to a condition of the wafer processing chamber; and during processing of a third substrate, controls the plurality of second thermal control elements in accordance with the at least one of the plurality of profiles as adjusted based on the determined non-uniformities in the first and second average etch rates.

2. The system of claim 1, wherein the first and second respective etch rates correspond to an etch rate of a film.

3. The system of claim 2, wherein the film includes silicon nitride.

4. The system of claim 1, wherein the first controller adjusts the at least one of the plurality of profiles when the non-uniformities in the first and second average etch rates of corresponding ones of the plurality of second thermal control elements are outside of corresponding uncertainty ranges.

5. The system of claim 4, wherein the first controller determines an uncertainty range of each of the non-uniformities in the first and second average etch rates using a variance of the non-uniformities in the first and second average etch rates.

6. The system of claim 1, wherein the first controller:
determines compensation values based on a quotient of the non-uniformities in the first and second average etch rates divided by the sensitivity of the first and second respective etch rates; and
adjusts the at least one of the plurality of profiles based on the compensation values.

7. The system of claim 1, wherein the condition of the chamber is a temperature of the ESC.

8. The system of claim 1, wherein the first controller controls the plurality of second thermal control elements further based on a difference between respective ones of the plurality of profiles and actual values of the condition of the wafer processing chamber at the plurality of second thermal control elements.

9. The system of claim 8, wherein:
the first controller determines the actual values of the temperature at the plurality of second thermal control elements based on resistances of the plurality of second thermal control elements.

10. A method for controlling a condition of a wafer processing chamber, the method comprising:
arranging a plurality of sets of first thermal control elements in respective zones of an electrostatic chuck (ESC) of the wafer processing chamber, wherein each of the sets of first thermal control elements is separately controllable to adjust a temperature of one of the respective zones;
distributing a plurality of second thermal control elements throughout each of the respective zones, wherein each of the second thermal control elements is separately controllable from the first thermal control elements and others of the second thermal control elements;
storing in memory a plurality of profiles of respective ones of the plurality of second thermal control elements;
determining, for a first substrate, first respective etch rates of each of the plurality of second thermal control elements at predetermined setpoints of the plurality of sets of first thermal control elements;
determining, for a second substrate, second respective etch rates of each of the plurality of second thermal control elements at the predetermined setpoints of the plurality of sets of first thermal control elements;
determining, using the first and second respective etch rates as determined for the first substrate and the second substrate at the predetermined setpoints of the plurality of sets of first thermal control elements, (i) a first average etch rate of the first and second respective etch rates for the first substrate and the second substrate for a first one of the plurality of second thermal control elements, (ii) a second average etch rate of the first and second respective etch rates for the first substrate and the second substrate for a second one of the plurality of second thermal control elements, and (iii) a third average etch rate of the first average etch rate and the second average etch rate;
determining non-uniformities for each of the first and second average etch rates using the first, second, and third average etch rates; and
adjusting at least one of the plurality of profiles based on the non-uniformities in the first and second average etch rates and a sensitivity of the first and second respective etch rates to a condition of the wafer processing chamber; and
during processing of a third substrate, controlling the plurality of second thermal control elements in accordance with the at least one of the plurality of profiles as adjusted based on the determined non-uniformities in the first and second average etch rates.

11. The method of claim 10, wherein the first and second respective etch rates correspond to an etch rate of a film.

12. The method of claim 11, wherein the film includes silicon nitride.

13. The method of claim 10, further comprising adjusting the at least one of the plurality of profiles when the non-uniformities in the first and second average etch rates of corresponding ones of the plurality of second thermal control elements are outside of corresponding uncertainty ranges.

14. The method of claim 13, further comprising determining an uncertainty range of each of the non-uniformities in the first and second average etch rates using a variance of the non-uniformities in the respective first and second average etch rates.

15. The method of claim 10, further comprising:
determining compensation values based on a quotient of the non-uniformities in the first and second average etch rates divided by the sensitivity of the first and second respective etch rates; and
adjusting the at least one of the plurality of profiles based on the compensation values.

16. The method of claim 10, wherein the condition of the chamber is a temperature of the ESC.

17. The method of claim 10, further comprising controlling the plurality of second thermal control elements further based on a difference between respective ones of the plurality of profiles and actual values of the condition of the wafer processing chamber at the plurality of second thermal control elements.

18. The method of claim 17, further comprising determining the actual values of the temperature at the plurality of second thermal control elements based on resistances of the plurality of second thermal control elements.

19. A system, comprising:
a plurality of sets of first thermal control elements arranged in respective zones of an electrostatic chuck (ESC) of a substrate processing chamber, wherein each of the sets of first thermal control elements is separately controllable to adjust a temperature of one of the respective zones;
a plurality of second thermal control elements distributed throughout each of the respective zones, wherein each of the second thermal control elements is separately controllable from the first thermal control elements and others of the second thermal control elements;
memory that stores a plurality of profiles of respective ones of the plurality of second thermal control elements;
a first controller configured to:
determine a first average of respective etch rates associated with a first one of the plurality of second thermal control elements for a plurality of substrates;
determine a second average of respective etch rates associated with a second one of the plurality of second thermal control elements for the plurality of substrates;
determine a third average using the first average and the second average;
determine respective non-uniformities of the first average and the second average using the third average;
adjust at least one of the plurality of profiles based on the respective non-uniformities; and
during processing of subsequent substrates, control the plurality of second thermal control elements in accordance with the at least one of the plurality of profiles as adjusted based on the respective non-uniformities.

* * * * *